(12) United States Patent
Yang

(10) Patent No.: US 9,018,034 B2
(45) Date of Patent: Apr. 28, 2015

(54) APPARATUS AND METHOD FOR MANUFACTURING OF THIN FILM TYPE SOLAR CELL

(75) Inventor: Cheol Hoon Yang, Seongnam-si (KR)

(73) Assignee: Jusung Engineering Co., Ltd. (KR)

( * ) Notice: Subject to any disclaimer, the term of this patent is extended or adjusted under 35 U.S.C. 154(b) by 572 days.

(21) Appl. No.: 13/227,978

(22) Filed: Sep. 8, 2011

(65) Prior Publication Data

US 2012/0064660 A1 Mar. 15, 2012

(30) Foreign Application Priority Data

Sep. 13, 2010 (KR) .................. 10-2010-0089473

(51) Int. Cl.
| | |
|---|---|
| *H01L 21/00* | (2006.01) |
| *H01L 31/18* | (2006.01) |
| *H01L 21/67* | (2006.01) |
| *H01L 21/677* | (2006.01) |
| *H01L 31/075* | (2012.01) |
| *H01L 31/076* | (2012.01) |
| *H01L 31/0463* | (2014.01) |

(52) U.S. Cl.
CPC .............. *H01L 31/18* (2013.01); *Y02E 10/548* (2013.01); *H01L 21/67028* (2013.01); *H01L 21/67051* (2013.01); *H01L 21/6708* (2013.01); *H01L 21/67173* (2013.01); *H01L 21/6776* (2013.01); *H01L 31/075* (2013.01); *H01L 31/076* (2013.01); *H01L 31/0463* (2014.12)

(58) Field of Classification Search
None
See application file for complete search history.

(56) References Cited

U.S. PATENT DOCUMENTS

| | | | |
|---|---|---|---|
| 6,265,652 B1 * | 7/2001 | Kurata et al. ................ | 136/244 |
| 6,745,784 B2 | 6/2004 | Katakabe et al. | |
| 2003/0168089 A1 | 9/2003 | Katakabe et al. | |
| 2008/0041430 A1 | 2/2008 | Cho et al. | |
| 2008/0105653 A1 | 5/2008 | Seah et al. | |
| 2008/0296262 A1 * | 12/2008 | Muller et al. .................. | 216/91 |
| 2010/0167458 A1 * | 7/2010 | Shin et al. ..................... | 438/73 |
| 2010/0229922 A1 * | 9/2010 | Pettersson ................... | 136/251 |
| 2011/0011437 A1 * | 1/2011 | Denda et al. ................. | 136/244 |

FOREIGN PATENT DOCUMENTS

| | | |
|---|---|---|
| JP | 11-264962 A | 9/1999 |
| JP | 2001-108977 A | 4/2001 |
| JP | 2003-77886 A | 3/2003 |

OTHER PUBLICATIONS

Office Action dated May 21, 2014; European Patent Application No. 11180085.0; 7 pages; European Patent Office.
Kenichi, Mimori; "Wetting Treatment Device"; Espacenet; Japanese Publication No. JP 2003077886 A; Japanese Publication Date: Mar. 14, 2003; Espacenet Database—Worldwide; http://worldwide.espacenet.com/.

(Continued)

*Primary Examiner* — Angel Roman
(74) *Attorney, Agent, or Firm* — Andrew D. Fortney; Central California IP Group, P.C.

(57) ABSTRACT

Disclosed is an apparatus and method for manufacturing a thin film type solar cell, which enables the enhancement of productivity, the apparatus for manufacturing a thin film type solar cell including a first electrode forming unit; a first separation part; an optoelectric conversion layer forming unit; a contact line forming unit; a printing unit; and an etching process unit, wherein the etching process unit removes the optoelectric conversion layer in a second separation part to expose the first electrode in the second separation part through a wet etching process.

18 Claims, 11 Drawing Sheets

(56) References Cited

OTHER PUBLICATIONS

Nishio, Mikio; "Apparatus for Manufacturing Liquid Crystal Display Device and Method for the Same"; Abstract of JP2001,108977 (A); Apr. 20, 2001; 2 pages; Espacenet.

Fujiwara, Masakuni and Oguro, Hiroyuki; "Manufacture of Liquid Crystal Display Device and Manufacturing Device Thereof"; Abstract of JPH11264962 (A); Sep. 28, 1999; 2 pages; Espacenet.

Extended European Search Report dated Nov. 14, 2014 in European Patent Application No. 14185570.0; European Patent Office; 7 pages.

* cited by examiner

FIG. 5
| 200 | 210 | 220 | 230 | 235 | 240 | 250 | 260 | 270 | 280 |
FIG. 6
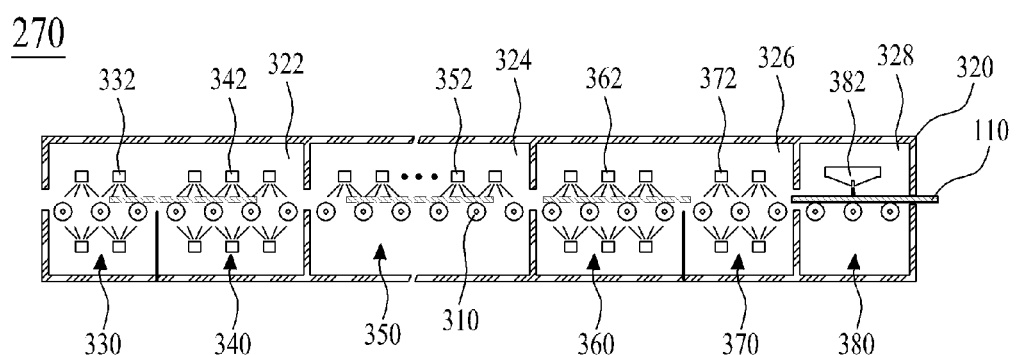
FIG. 7
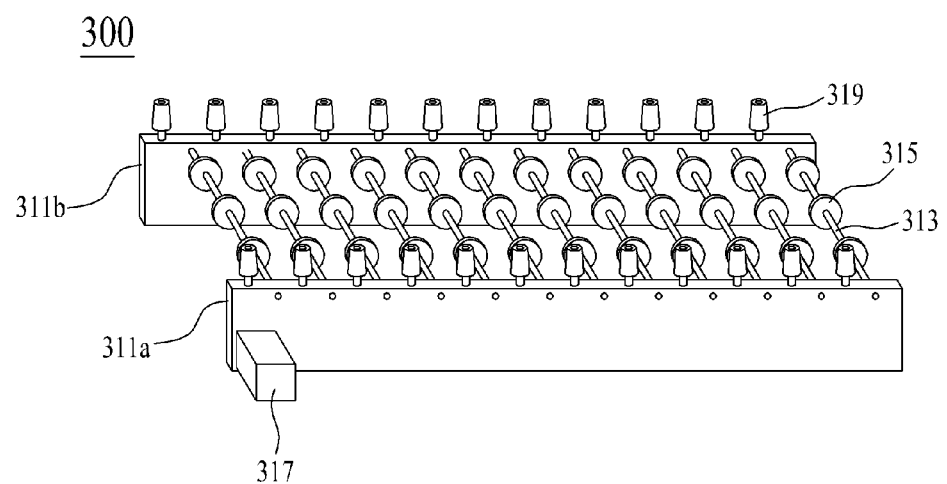

APPARATUS AND METHOD FOR MANUFACTURING OF THIN FILM TYPE SOLAR CELL

CROSS REFERENCE TO RELATED APPLICATIONS

This application claims the benefit of the Korean Patent Application No. 10-2010-0089473 filed on Sep. 13, 2010, which is hereby incorporated by reference as if fully set forth herein.

BACKGROUND

1. Field of the Invention

The present invention relates to a thin film type solar cell, and more particularly, to an apparatus and method for manufacturing a thin film type solar cell, which enables the enhancement of productivity.

2. Discussion of the Related Art

Solar cells are apparatuses that convert light energy into electric energy by using semiconductor properties.

To provide a brief description on the structure and principle of solar cells, solar cells have a P-N junction structure where a positive (P) type semiconductor is joined to a negative (N) type semiconductor. When solar light is incident on a solar cell having the structure, holes and electrons are generated in a semiconductor by energy of the solar light. At this point, by an electric field that is generated through P-N junction, the holes "+" move to a P type semiconductor, and the electrons "−" move to an N type semiconductor, thereby generating a potential and thus producing a power. With this principle, solar cells produce a power.

Such solar cells are categorized into substrate type solar cells and thin film type solar cells.

Substrate type solar cells are manufactured using a semiconductor material such as silicon as a substrate, and thin film type solar cells are manufactured by forming a thin film type semiconductor on a substrate such as a glass.

Substrate type solar cells have better efficiency than thin film type solar cells, but have the limitation of a process in minimizing thickness. Also, since substrate type solar cells use a high-cost semiconductor substrate, the manufacturing cost increases, and moreover, it is difficult to use the substrate type solar cell in place of a window of a building because it is not easy to secure a light-transmitting region.

Thin film type solar cells have efficiency lower than substrate type solar cells. However, since thin film type solar cells are manufactured to have a thin thickness with a low-cost material, the manufacturing cost decreases, and thus, thin film type solar cells are suitable for mass production. Moreover, thin film type solar cells can be used in place of a window of a building because it is relatively easy to secure a light-transmitting region.

FIGS. 1A to 1F are sectional views sequentially illustrating a method of manufacturing a typical thin film type solar cell.

A method of manufacturing a typical thin film type solar cell will be described below with reference to FIGS. 1A to 1F.

As illustrated in FIG. 1A, a first electrode 20 is formed over a substrate 10, and then an electrode separation part 30 is formed by removing the first electrode 20 at certain intervals in order for a certain region of the substrate 10 to be exposed, through a laser scribing process.

As illustrated in FIG. 1B, an optoelectric conversion layer 40 is formed over the substrate 10 on which the first electrode 20 is formed.

As illustrated in FIG. 1C, a transparent conductive layer 50 is formed on the optoelectric conversion layer 40.

As illustrated in FIG. 1D, a contact line 60 is formed by simultaneously removing the optoelectric conversion layer 40 and the transparent conductive layer 50 in order for a certain region of the first electrode 20 to be exposed, through the laser scribing process.

As illustrated in FIG. 1E, a second electrode 70 is formed on the contact line 60 and the transparent conductive layer 50. In this point, the second electrode 70 is electrically connected to the first electrode 20 through the contact line 60.

As illustrated in FIG. 1F, a cell separation part 80 is formed by simultaneously removing the second electrode 70, the optoelectric conversion layer 40, and the transparent conductive layer 50 in order for a certain region of the first electrode 20 adjacent to the contact line 60 to be exposed, through the laser scribing process.

The above-described method of manufacturing the typical thin film type solar cell has the following limitations.

First, the typical method forms the cell separation part 80 by simultaneously removing the second electrode 70, the optoelectric conversion layer 40, and the transparent conductive layer 50, through the laser scribing process using a laser irradiating device. Therefore, as the substrate 10 is enlarged, long time is taken in the laser scribing process. Furthermore, when using a plurality of laser irradiating devices for shortening time taken in the laser scribing process, the cost increases.

Second, since a window of a building is required to guarantee a prospect right, a light-transmitting region is required to be secured by a certain degree for using the thin film type solar cell in place of the window of the building. However, since the light-transmitting region is limited by the cell separation part 80 that is a region between the second electrodes 70 and thus a prospect right is not guaranteed, the laser scribing process is performed several times when enlarging the width of the cell separation part 30 for guaranteeing the prospect right, causing the reduction in productivity.

SUMMARY

Accordingly, the present invention is directed to an apparatus and method for manufacturing a thin film type solar cell, which enables the enhancement of productivity.

An aspect of the present invention is to provide an apparatus and method for manufacturing a thin film type solar cell, which enables the increase in the productivity of the thin film type solar cell that can secure a prospect right sufficient to apply the solar cell in place of a window.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an apparatus for manufacturing a thin film type solar cell including: a first electrode forming unit configured to form a first electrode on a substrate and a first separation part separating the first electrode; an optoelectric conversion layer forming unit configured to form an optoelectric conversion layer over the substrate, the substrate further including the first electrode and the first separation part; a contact line forming unit configured to remove a certain region of the optoelectric conversion layer on the first electrode to form a contact line; a printing unit configured to print a second electrode on the optoelectric conversion layer, the second electrode being connected to the first electrode through the contact line and separated at certain intervals by a second separation part; and an etching process unit configured to remove the optoelectric conversion layer in the second separation part and expose the first electrode using an etching process (e.g., by wet etching).

In another aspect of the present invention, there is provided a method of manufacturing a thin film type solar cell including: forming a first electrode over a substrate; removing a certain region of the first electrode to form a first separation part; forming an optoelectric conversion layer over the substrate, the substrate further including the first electrode and the first separation part; removing a certain region of the optoelectric conversion layer on the first electrode to form a contact line; printing a second electrode on the optoelectric conversion layer, the second electrode being connected to the first electrode through the contact line and separated at certain intervals by a second separation part; and etching the optoelectric conversion layer in the second separation part to expose the first electrode (e.g., using a wet etching process).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 5 is a block diagram schematically illustrating an apparatus for manufacturing a thin film type solar cell, according to an embodiment of the present invention;

FIG. 6 is a view schematically illustrating an etching process of FIG. 5;

FIG. 7 is a view schematically illustrating a conveyor of FIG. 6;

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

FIGS. 2A to 2F are sectional views sequentially illustrating a method of manufacturing a thin film type solar cell, according to a first embodiment of the present invention.

The method of manufacturing a thin film type solar cell, according to the first embodiment of the present invention, will be sequentially described below with reference to FIGS. 2A to 2F.

Figure 1A:
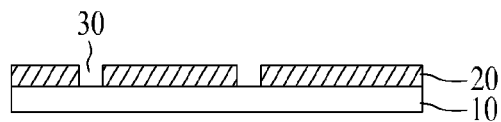
FIGS. 1A to 1F are sectional views sequentially illustrating a method of manufacturing a typical thin film type solar cell.
Figure 1B:
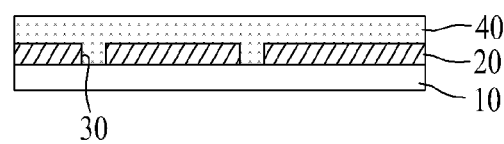
Figure 1C:
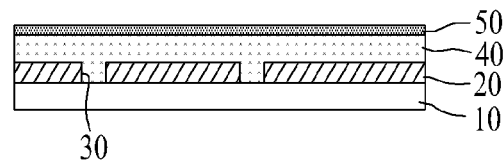
Figure 1D:
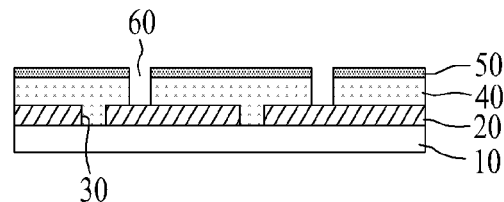
Figure 1E:
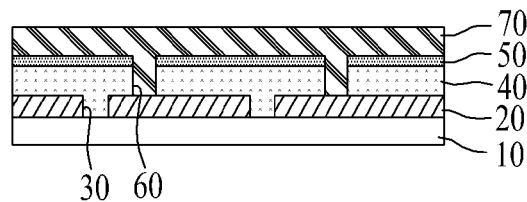
Figure 1F:
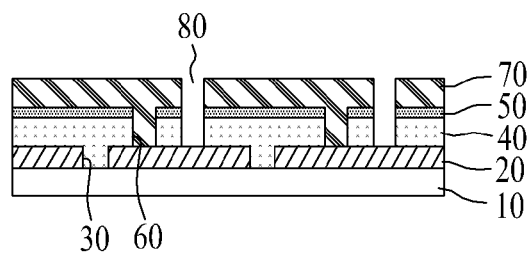
Figure 2A:
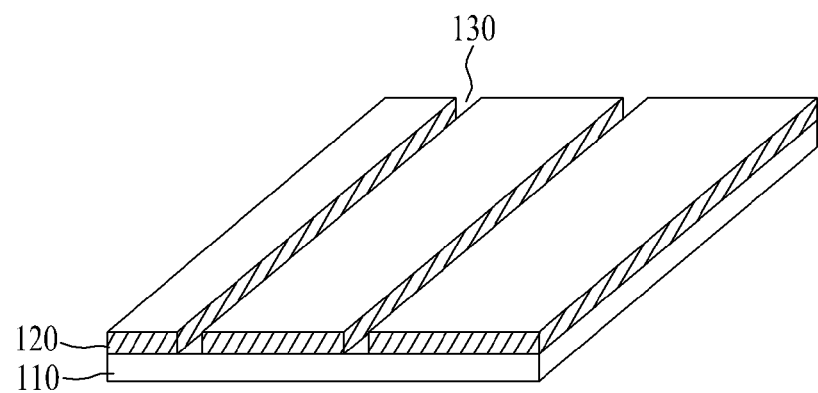
FIGS. 2A to 2F are sectional views sequentially illustrating a method of manufacturing a thin film type solar cell, according to a first embodiment of the present invention.

As illustrated in FIG. 2A, a first electrode 120 is formed over a substrate 110, and then a first separation part 130 is formed by removing the first electrode 120 at certain intervals in order for a certain region of the substrate 110 to be exposed, through a laser scribing process.

The substrate 110 may be a glass substrate, a metal substrate, a plastic substrate, or a flexible substrate. When a glass substrate is used as the substrate 110, the manufacturing cost of a solar cell can be reduced. On the other hand, when a metal substrate, a plastic substrate, or a flexible substrate is used as the substrate 110, a solar cell can be thinned and lightened, and a flexible solar cell can be manufactured. For example, the metal substrate may be formed of aluminum or a stainless material, and the flexible substrate may be formed of a thin glass (having a thickness of about 50 μm to about 200 μm), a metal foil, or a plastic material. The plastic material may be thermoplastic semicrystalline polymer (TSP) such as polycarbonate (PC), polyethylene terephthalate (PET), polyethersulfone (PES), polyimide (PI), polyethylene naphthalate (PEN), and polyetheretherketone (PEEK).

The first electrode 120 may be formed of a transparent conductive material such as $SnO_2$, $SnO_2$:F, $SnO_2$:B, $SnO_2$:Al, or indium tin oxide (ITO), over the substrate 110. The first electrode 120 may be formed by a Chemical Vapor Deposition (CVD) process.

The first electrode 120 is a surface on which solar light is incident, and thus, in order for the solar light to be maximally absorbed to inside a solar cell, the first electrode 120 may be formed to have a concave-convex structure through a texturing process. The texturing process is a process that processes a material surface in a shape such as a fabric surface in order for the material surface to have a rough concave-convex structure, and may be performed through an etching process using photolithography, an anisotropic etching process using chemical solution, or a groove forming process using mechanical scribing.

Figure 2B:
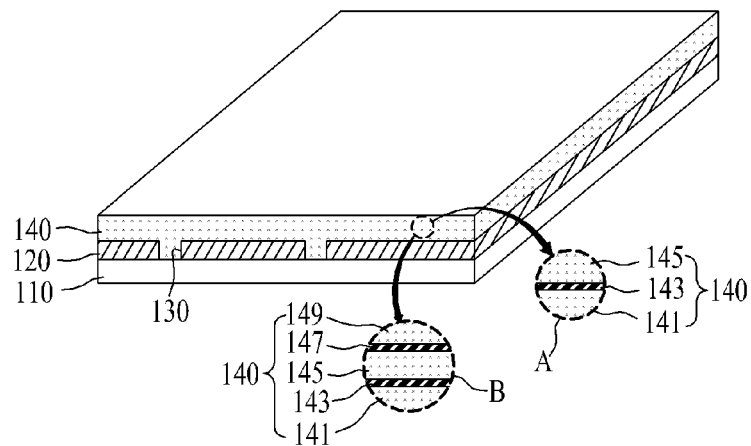

As illustrated in FIG. 2B, an optoelectric conversion layer 140 is formed over the substrate 110 on which the first separation part 130 and the first electrode 120 are formed.

The optoelectric conversion layer 140 according to the first embodiment of the present invention may be formed of a silicon-based semiconductor material, and have a PIN structure where a P type semiconductor layer, an I type semiconductor layer, and an N type semiconductor layer are sequentially stacked. Herein, an N or P type semiconductor layer thinner than the N or P type semiconductor layer may be formed instead of the I type semiconductor layer, and an N or P type semiconductor layer with a doping concentration lower than that of the N or P type semiconductor layer may be formed instead of the I type semiconductor layer.

In this way, when the optoelectric conversion layer 140 is formed in the PIN structure, the I type semiconductor layer is depleted by the P type semiconductor layer and the N type semiconductor layer, and thus, an electric field is generated internally. Furthermore, a hole and electron generated by solar light are drifted by the electric field and respectively recovered in the P type semiconductor layer and the N type semiconductor layer.

When the optoelectric conversion layer 140 is formed in the PIN structure, the P type semiconductor layer may be formed on the first electrode 120, and then the I type semiconductor layer and the N type semiconductor layer may be formed. The reason is for forming the P type semiconductor layer closely to a light receiving surface so as to maximize recovery efficiency by incident light because the drift mobility of a hole is lower than that of an electron.

An optoelectric conversion layer 140 according to a second embodiment of the present invention, as illustrated in an enlarged portion A in FIG. 2B, may be formed in a tandem structure where a first optoelectric conversion layer 141, a buffer layer 143, and a second optoelectric conversion layer 145 are sequentially stacked.

Each of the first and second optoelectric conversion layers 141 and 145 may be formed in a PIN structure where a P type semiconductor layer, an I type semiconductor layer, and an N type semiconductor layer are sequentially stacked.

The buffer layer 143 allows a hole and an electron to smoothly move through tunnel junction between the first and second optoelectric conversion layers 141 and 145, and may be formed of a transparent conductive material that is easily removed by a wet etching process.

An optoelectric conversion layer 140 according to a third embodiment of the present invention, as illustrated in an enlarged portion B in FIG. 2B, may be formed in a triple structure where a first optoelectric conversion layer 141, a first buffer layer 143, a second optoelectric conversion layer 145, a second buffer layer 147, and a second optoelectric conversion layer 149 are sequentially stacked.

Each of the first to third optoelectric conversion layers 141, 145 and 149 may be formed in a PIN structure where a P type semiconductor layer, an I type semiconductor layer, and an N type semiconductor layer are sequentially stacked.

Each of the first and second buffer layers 143 and 147 allows a hole and an electron to smoothly move through tunnel junction between the first to third optoelectric conversion layers 141, 145 and 149, and may be formed of a transparent conductive material that is easily removed by a wet etching process.

Figure 2C:
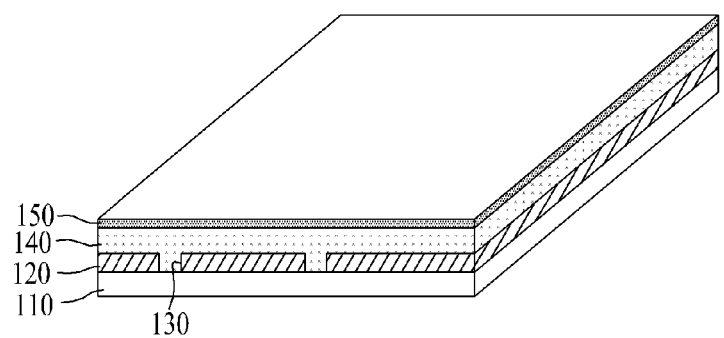

As illustrated in FIG. 2C, a transparent conductive layer 150 is formed on the optoelectric conversion layer 140.

The transparent conductive layer 150 diffuses solar light that has passed through the optoelectric conversion layer 140 to travel the solar light at various angles. Furthermore, the solar light is reflected by the below-described second electrode 170, and thus, the rate of light again incident on the optoelectric conversion layer 140 increases, thereby enhancing efficiency of a solar cell. In this case, the transparent conductive layer 150 may be formed of a transparent conductive material that is easily removed by the wet etching process, for example, any one of ZnO, ZnO:B, ZnO:Al, and ZnO:H. The transparent conductive layer 150 may not be formed.

Figure 2D:
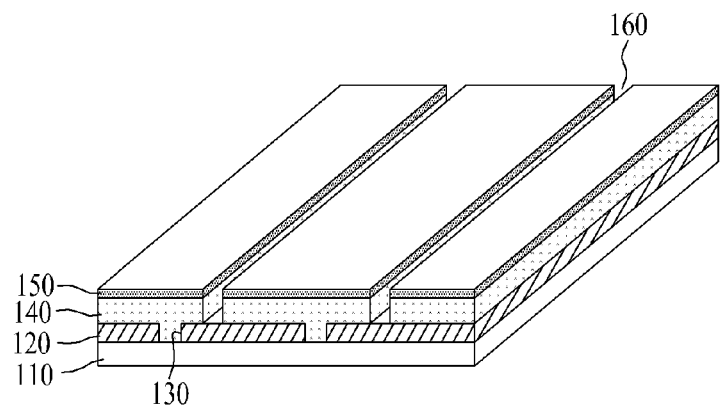

As illustrated in FIG. 2D, a contact line 160 is formed by simultaneously removing a certain region of the optoelectric conversion layer 140 and a certain region of the transparent conductive layer 150 that are formed on the first electrode 120, through the laser scribing process. At this point, the contact line 160 is formed in parallel to the first separation part 130 to expose a certain region of the first electrode 120 adjacent to the first separation part 130.

Figure 2E:
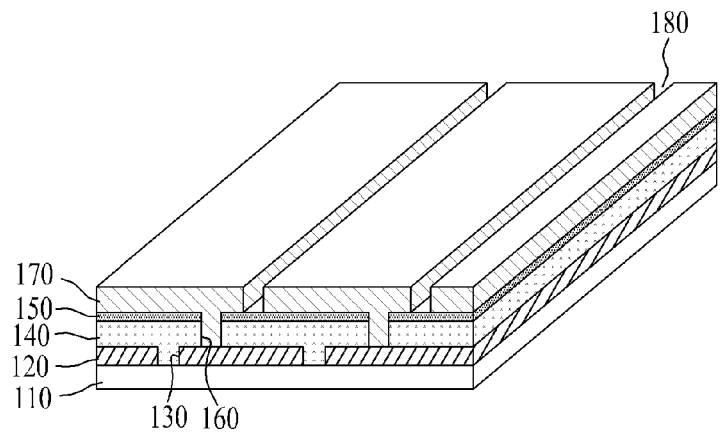

As illustrated in FIG. 2E, a second electrode 170, which is connected to the first electrode 120 through the contact line 160 and is separated at a certain interval with a second separation part 180 therebetween, is printed on the optoelectric conversion layer 140. At this point, the second separation part 180 is formed on the transparent conductive layer 150 on the first electrode 120 in parallel to the contact line 160 to separate the second electrode 170 by a certain interval.

The second electrode 170 may be formed by one-time printing process using a metal paste including Ag, Al, Cu, Ag+Mo, Ag+Ni, or Ag+Cu.

The printing process may be a screen printing process, an inkjet printing process, a gravure printing process, a gravure offset printing process, a reverse printing process, a flexo printing process, or a micro contact printing process. Herein, the screen printing process is a process that lays ink on a screen, moves a squeegee while applying a certain pressure to the squeegee, and transfers the ink through a mesh of the screen. The inkjet printing process is a process that performs printing by colliding a very small blob of ink to a substrate. The gravure printing process is a process that removes ink, stained to a flat non-curve portion, with a doctor blade, and transfers only ink, stained to a concave curve portion that is formed through etching, to a substrate, thereby performing printing. The gravure offset printing process is a process that transfers ink from a printing plate to a blanket and again transfers the ink of the blanket to a substrate. The reverse printing process is a process that performs printing by using a solvent as ink. The flexo printing process is a process that stains ink to an embossed portion to perform printing. The micro contact printing process is a process that lays a desired material on a stamp and stamps the material as in a seal, thereby performing printing.

The second electrode 170 is printed by the printing process, and then a sintering process may be additionally performed for the printed second electrode 170.

Figure 2F:
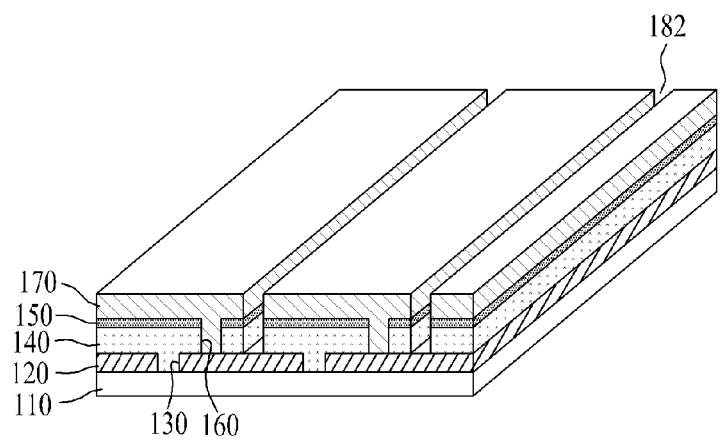

As illustrated in FIG. 2F, by simultaneously removing the transparent conductive layer 150 and optoelectric conversion layer 140 in the second separation part 180 through a wet etching process using the second electrode 170 as a mask to expose the first electrode 120, a cell separation part 182 for separating the optoelectric conversion layer 140 is formed.

The wet etching process successively performs a primary cleaning process, an etching process, a secondary cleaning process, and a dry process while continuously conveying the substrate 110 with a conveyor.

The primary cleaning process may include a foreign substance removing process and a first rinsing process.

The foreign substance removing process sprays first de-ionized water DI having a high pressure on the substrate 110 to remove a foreign substance from the substrate 110. At this point, the first de-ionized water having a high pressure may be sprayed on a top and bottom of the substrate 110.

The first rinsing process sprays second de-ionized water on the substrate 110, for which a foreign substance removing process has been completed, to rinse the substrate 110. At this point, the second de-ionized water may be sprayed on the top and bottom of the substrate 110. Furthermore, the second de-ionized water, which is used in the first rinsing process and then recovered, may be used as the first de-ionized water that is used in the foreign substance removing process.

The etching process simultaneously removes the transparent conductive layer 150 and optoelectric conversion layer 140 in the second separation part 180 to expose the first electrode 120, by using alkaline solution.

The etching process simultaneously removes the transparent conductive layer 150 and optoelectric conversion layer 140 in the second separation part 180 by sprinkling alkaline etching solution on the substrate 110 in a spray process. In this case, the alkaline etching solution may be sprayed at a pressure of about 0.5 Pa to about 2 Pa, and the spayed alkaline etching solution may be sprayed to overlaps with each other over the substrate 110.

The alkaline etching solution may use at least one solution selected from alkaline-based materials such as NaOH, NH$_4$OH and KOH, or use at least one solution selected from acidic solution such as HCl, HNO$_3$, H$_2$SO$_4$, H$_3$PO$_3$, H$_3$PO$_4$, H$_2$O$_2$, HCOOH or C$_2$H$_2$O$_4$. In this case, using OH-series alkaline-based etching solution is optimal, but H-series acidic-based etching solution may be used.

Alkaline etching solution may be diluted with water and used, in which case the concentration of alkaline solution may be a range of about 5% to about 20%. Furthermore, the temperature of the alkaline etching solution may be maintained at about 60° C. to about 80° C., and an etching time may be a range of about 40 sec to about 80 sec.

In the etching process, since the first electrode 120 formed in the second separation part 180 is formed of a transparent conductive material, which is not easily removed by alkaline etching solution, such as SnO$_2$, SnO$_2$:F, SnO$_2$:B, SnO$_2$:Al, or ITO, the first electrode 120 is not damaged by the etching process.

The secondary cleaning process may include a first rinsing process and a final rinsing process.

The second rinsing process sprays third de-ionized water on the substrate 110, for which the etching process has been completed, to rinse (or clean) alkaline etching solution that is left on the substrate 110. At this point, the third de-ionized water may be sprayed on the top and bottom of the substrate 110. Furthermore, the third de-ionized water, which is used in the second rinsing process and then recovered, may be used as the second de-ionized water that is used in the first rinsing process.

The final rinsing process sprays fourth de-ionized water on the substrate 110, for which the second rinsing process has been completed, to finally rinse the substrate 110. At this point, the fourth de-ionized water may be sprayed on the top and bottom of the substrate 110. Furthermore, the fourth de-ionized water, which is used in the final rinsing process and then recovered, may be used as the third de-ionized water that is used in the second rinsing process.

The dry process dries the substrate 110 for which the final rinsing process has been completed, with an air knife. Herein, the air knife may be disposed to be inclined at a certain angle with respect to a direction in which the substrate 110 is conveyed.

The above-described method of manufacturing the thin film type solar cell, according to the first embodiment of the present invention, forms the second electrode 170 in the printing process and then forms the cell separation part 182 for separating the optoelectric conversion layer 140 in the wet etching process using the spray process, thus decreasing time taken in a process of forming the cell separation part 182. Also, the method does not use the laser scribing process, and thus can reduce the cost. Herein, since the second electrode 170 is formed of a metal material, the second electrode 170 functions as a mask having properties that are not etched by the wet etching process, and thus, in the wet etching process using the spray process, only a region in the second separation part 182 is etched using the second electrode 170 as the mask.

FIGS. 3A to 3F are sectional views for sequentially describing a method of manufacturing a thin film type solar cell, according to a second embodiment of the present invention.

The method of manufacturing a thin film type solar cell, according to the second embodiment of the present invention, will be sequentially described below with reference to FIGS. 3A to 3F.

The method of manufacturing a thin film type solar cell, according to the second embodiment of the present invention, relates to a method of manufacturing a thin film type solar cell that is used in place of a window of a building. A detailed description on the same elements as the above-described elements will not be provided below, and like reference numerals refer to like elements throughout.

Figure 3A:
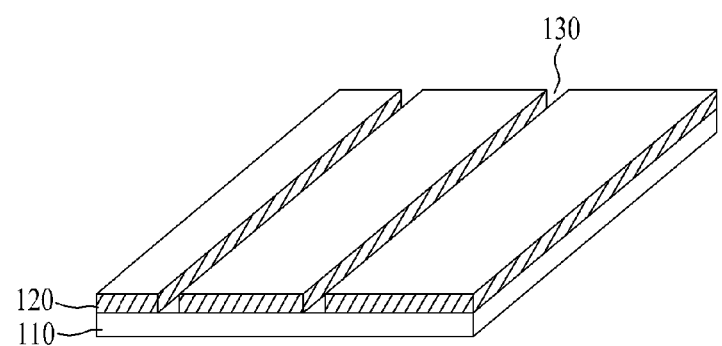
FIGS. 3A to 3F are sectional views sequentially illustrating a method of manufacturing a thin film type solar cell, according to a second embodiment of the present invention.

As illustrated in FIG. 3A, a first electrode 120 is formed over a substrate 110, and then a first separation part 130 is formed by removing the first electrode 120 at certain intervals in order for a certain region of the substrate 110 to be exposed, through the laser scribing process.

Figure 3B:
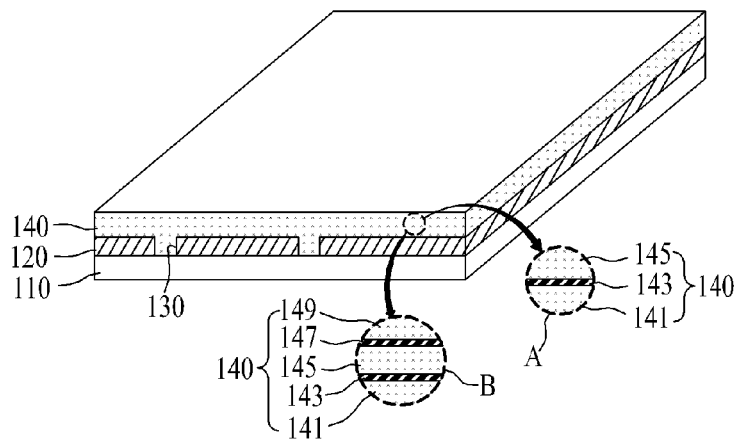

As illustrated in FIG. 3B, an optoelectric conversion layer 140 is formed over the substrate 110 on which the first separation part 130 and the first electrode 120 are formed.

Figure 3C:
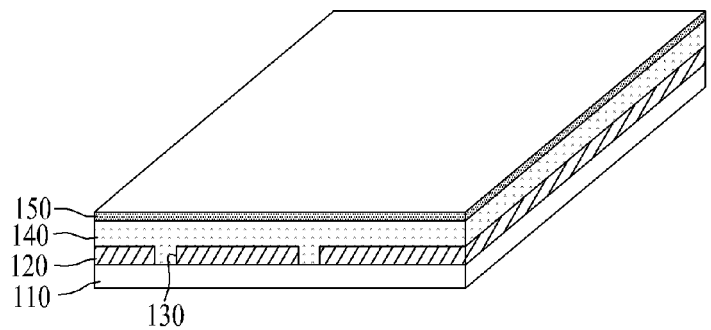

As illustrated in FIG. 3C, a transparent conductive layer 150 is formed on the optoelectric conversion layer 140.

Figure 3D:
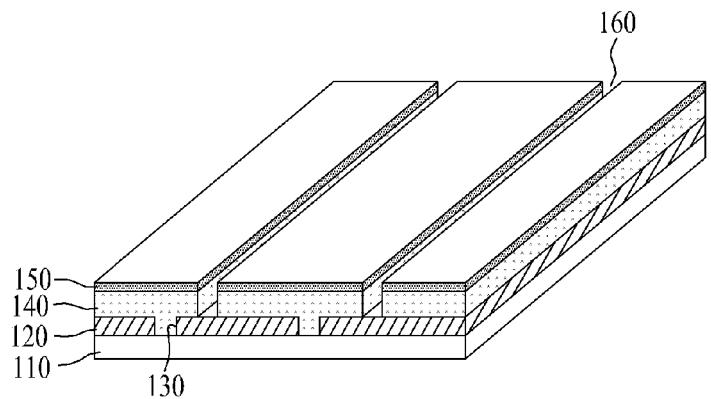

As illustrated in FIG. 3D, a contact line 160 is formed by removing a certain region of the optoelectric conversion layer 140 and a certain region of the transparent conductive layer 150 that are formed on the first electrode 120, through the laser scribing process. At this point, the contact line 160 is formed in parallel to a first separation part 130 to expose a certain region of the first electrode 120 adjacent to the first separation part 130.

Figure 3E:
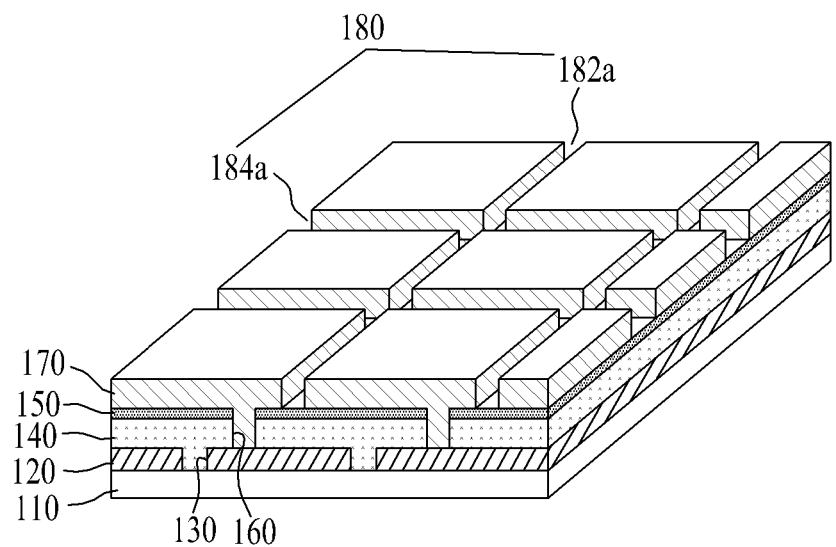

As illustrated in FIG. 3E, a second electrode 170, which is connected to the first electrode 120 through the contact line 160 and is separated by a certain interval with a second separation part 180 therebetween, is printed on the optoelectric conversion layer 140. At this point, the second separation part 180 includes a cell separation pattern 182a that is formed on the transparent conductive layer 150 on the first electrode 120 in parallel to the contact line 160 and separates the second electrode 170 at certain intervals, and a light transmission pattern 184a that is formed by removing the second electrode 170 in a certain pattern.

The second electrode 170 is printed by the printing process, and then a sintering process may be additionally performed for the printed second electrode 170.

Figure 3F:
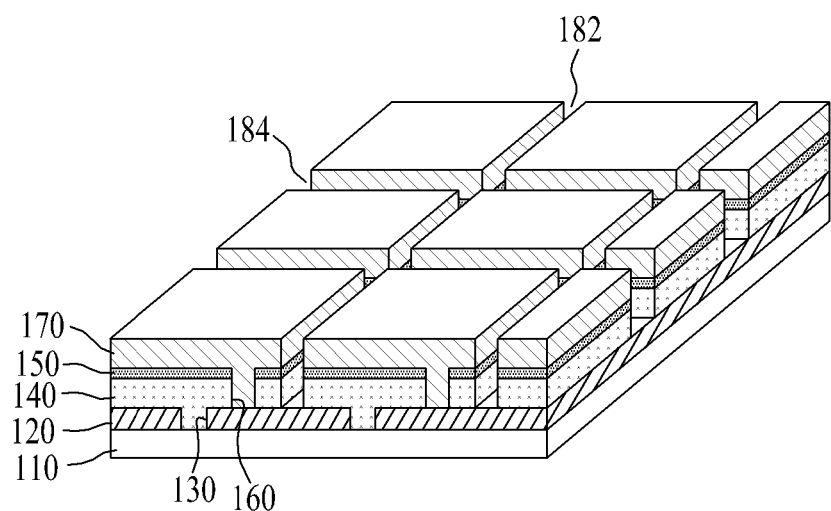

As illustrated in FIG. 3F, by simultaneously removing the transparent conductive layer 150 and optoelectric conversion layer 140 in the cell separation pattern 182a and light transmission pattern 184a through the wet etching process using the second electrode 170 as a mask to expose the first electrode 120, the cell separation part 182 is formed, and simultaneously a light transmission part 184 that exposes the first electrode 120 for solar cell to be transmitted is formed. Herein, the wet etching process is the same as that of the first embodiment using the spray process with alkaline etching solution, and thus, its description will be applied to the below-described embodiment.

Figure 4A:
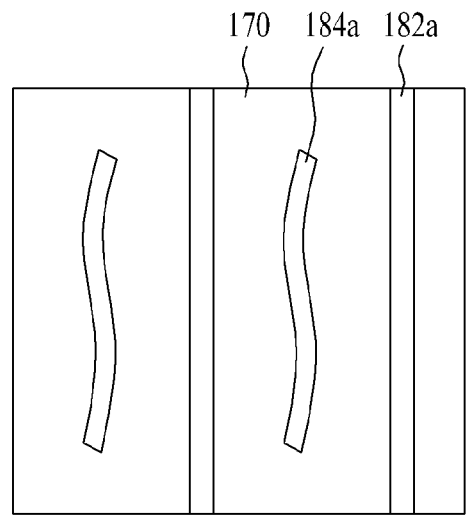
FIGS. 4A and 4B are views for describing various embodiments of a light transmission pattern illustrated in FIG. 3E.
Figure 4B:
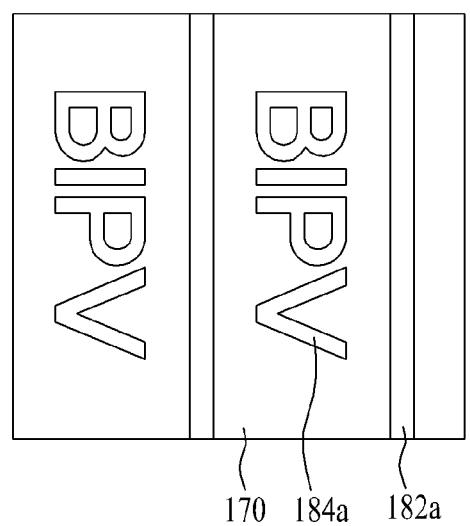

The light transmission pattern 184a of the second separation part 180, as illustrated in FIG. 3F, may be formed in a stripe type intersecting the cell separation pattern 182a, but the embodiment is not limited thereto. The light transmission pattern 184a may be formed in various types. For example, the light transmission pattern 184a, as illustrated in FIG. 4A, may be formed in a curved shape, or as illustrated in FIG. 4B, may be prepared in a character shape. Also, although not shown, the light transmission pattern 184a may be formed in at least one of a figure shape, a sign shape, and a character shape, and formed in various shapes depending on the case.

The above-described method of manufacturing the thin film type solar cell, according to the second embodiment of the present invention, forms the second electrode 170 in the printing process, and then forms the cell separation part 182 for separating the optoelectric conversion layer 140 in the wet etching process using the spray process and simultaneously forms the light transmission part 184 at the second electrode 170. Therefore, the method according to the second embodiment of the present invention does not use the laser scribing process, and thus can decrease the cost, more shorten time taken in a process than the related art laser scribing process, secure a prospect right sufficient to apply a solar cell in place of a window by using the cell separation part 182 and the light transmission part 184, and facilitate mass production.

FIG. 5 is a block diagram schematically illustrating an apparatus for manufacturing a thin film type solar cell, according to an embodiment of the present invention.

Referring to FIG. 5, the apparatus for manufacturing a thin film type solar cell, according to an embodiment of the present invention, includes a loading unit 200, a first electrode forming unit 210, an electrode separating unit 220, an optoelectric conversion layer forming unit 230, a contact line forming unit 240, a printing unit 250, a sintering unit 260, an etching process unit 270, and an unloading unit 280.

The loading unit 200 provides a substrate (not shown) to the first electrode forming unit 210. Herein, the substrate may be a glass substrate, a metal substrate, a plastic substrate, or a flexible substrate.

The first electrode forming unit 210, as illustrated in FIGS. 2A and 3A, forms the first electrode 120 that is formed of a transparent conductive material such as $SnO_2$, $SnO_2$:F, $SnO_2$:B, $SnO_2$:Al, or ITO, over the substrate 210 provided by the loading unit 200. The first electrode forming unit 210 may form the first electrode 120 in the CVD process. The first electrode forming unit 210 may be configured in a cluster type or an inline type.

As illustrated in FIG. 2A or 3A, the electrode separating unit 220 removes a certain region of the first electrode 120 that is formed over the substrate by the first electrode forming unit 210 and thus forms the first separation part 130 for separating the first electrode 120 at certain intervals. At this point, the electrode separating unit 220 may form the first separation part 130 in the laser scribing process.

Since the first electrode 120 is a surface on which solar light is incident, the solar light is required to be maximally absorbed to inside a solar cell, for which a texturing unit (not shown) for forming a texture at the surface of the first electrode 20 may be disposed between the first electrode forming unit 210 and the electrode separating unit 220.

As illustrated in FIG. 2B or 3B, the optoelectric conversion layer forming unit 230 forms the optoelectric conversion layer 140, over the substrate on which the first separation part 130 and the first electrode 120 are formed. The optoelectric conversion layer forming unit 230 forms at least one optoelectric conversion layer, which is formed in a PIN structure where a P type semiconductor layer, an I type semiconductor layer, and an N type semiconductor layer are sequentially stacked, over the substrate by using a plurality of chambers that are disposed in a cluster type to perform the CVD process. As illustrated in the enlarged portion A of FIG. 2B or the enlarged portion B of FIG. 3B, when the optoelectric conversion layer 140 is formed in a multiple-stacked structure, namely, a tandem structure or a triple structure, the buffer layers 143 and 147 are formed between the optoelectric conversion layers 141, 145 and 149.

As illustrated in FIG. 2C or 3C, the apparatus for manufacturing the thin film type solar cell, according to an embodiment of the present invention, may further include a transparent conductive layer forming unit 235 that forms the transparent conductive layer 150 on the optoelectric conversion layer 140.

The transparent conductive layer forming unit 235 forms the transparent conductive layer 150 on the optoelectric conversion layer 140, in a Metal Organic Chemical Vapor Deposition (MOCVD) process or a Plasma-Enhanced Chemical Vapor Deposition (PECVD). In this case, the transparent conductive layer 150 may be formed of a transparent conductive material that is easily removed by the wet etching process, for example, any one of ZnO, ZnO:B, ZnO:Al, and ZnO:H. The transparent conductive layer 150 may not be formed according to the structure of a solar cell, in which case the transparent conductive layer forming unit 245 is not also provided.

As illustrated in FIG. 2D or 3D, the contact line forming unit 240 forms the contact line 160 by simultaneously removing a certain region of the optoelectric conversion layer 140 and a certain region of the transparent conductive layer 50 that are formed on the first electrode 120 adjacent to the first separation part 130. Therefore, the optoelectric conversion layer 140 is separated at certain intervals with the contact line 160 therebetween. The contact line forming unit 240 may form the contact line 160 in the laser scribing process.

As illustrated in FIG. 2E, the printing unit 250 according to the first embodiment of the present invention prints the second electrode 170, which is connected to the first electrode 120 through the contact line 160 and is separated by a certain interval with the second separation part 180 therebetween, on the optoelectric conversion layer 150. At this point, the second separation part 180 is formed on the transparent conductive layer 150 on the first electrode 120 in parallel to the contact line 160 to separate the second electrode 170 at certain intervals.

The printing unit 250 forms the second electrode 170 through one-time printing process using a metal paste including Ag, Al, Cu, Ag+Mo, Ag+Ni, or Ag+Cu.

The printing unit 250 may perform the printing process such as the screen printing process, inkjet printing process, gravure printing process, gravure offset printing process, reverse printing process, flexo printing process, or micro contact printing process.

As illustrated in FIG. 3E, a printing unit 250 according to the second embodiment of the present invention prints the second electrode 170, which is connected to the first electrode 120 through the contact line 160 and is separated by a certain interval with the second separation part 180 therebetween, on the optoelectric conversion layer 150. At this point, the second separation part 180 includes the cell separation pattern 182a that is formed on the transparent conductive layer 150 on the first electrode 120 in parallel to the contact line 160 and separates the second electrode 170 at certain intervals, and the light transmission pattern 184a from which the second electrode 170 separated by the cell separation pattern 182a has been removed in a certain pattern.

The printing unit 250 forms the second electrode 170 through one-time printing process using a metal paste including Ag, Al, Cu, Ag+Mo, Ag+Ni, or Ag+Cu.

The sintering unit 260 removes a solvent that is volatilized from a paste of the second electrode 170 through heat treatment such as heating of the substrate on which the second electrode 170 has been printed by the printing unit 250, thereby sintering the second electrode 170.

The etching process unit 270, as illustrated in FIG. 2F, simultaneously removes the transparent conductive layer 150 and optoelectric conversion layer 140 in the second separation part 180 though the wet etching process based on the spray process using the second electrode 170 as the mask, and thus forms the cell separation part 180 exposing the first electrode 120. Alternatively, the etching process unit 270, as illustrated in FIG. 2F, simultaneously removes the transparent conductive layer 150 and optoelectric conversion layer 140 in the cell separation pattern 182a and light transmission pattern 184a to form the light transmission part 184 and the cell separation part 182 exposing the first electrode 120.

The unloading unit 280 unloads a substrate, for which an etching process has been completed by the etching process unit 270, to the outside.

FIG. 6 is a view schematically illustrating an etching process of FIG. 5.

Referring to FIGS. 5 and 6, the etching process unit 270 includes a conveyor 310, a bath 320, primary cleaning units 330 and 340, a wet etching unit 350, secondary cleaning units 360 and 370, and a drying unit 380.

The conveyor 310 is installed to pass through a side of the bath 320, and conveys the substrate 110 on which the second electrode 170 has been formed. For this end, as illustrated in FIG. 7, the conveyor 310 includes first and second conveyor frames 311a and 311b, a plurality of driving shafts 313, a plurality of rollers 315, a driving motor 317, and a plurality of guide rollers 319.

The first and second conveyor frames 311a and 311b are installed side by side to be separated by a certain interval.

Each of the driving shafts 313 is rotatably installed so as to have a certain interval between the first and second conveyor frames 311a and 311b.

The rollers 315 are installed at certain intervals, on each of the driving shafts 313 and convey the substrate 110 with the rotation of the driving shaft 313.

The driving motor 317 is installed at an outer side of the first conveyor frame 311a to simultaneously rotate the driving shafts 313. At this point, the rotating force of the driving motor 317 is transferred to the driving shafts 313 through a rotation transferring member (not shown) that is installed inside the first conveyor frame 311a. The rotation transferring member is coupled to the rotating shaft of the driving motor 317 and each of the driving shafts 313, and may be configured with a chain module, a gear module, or a belt module.

Some of the guide rollers 319 are rotatably installed at a top of the first conveyor frame 311a, and the other guide rollers 319 are rotatably installed at a top of the second conveyor frame 311b. The guide rollers 319 guide both sides of the substrate 110 that is conveyed by the rollers 315, thus preventing the substrate 110 from deviating from the conveyor 310.

The bath 320 is disposed to cover the conveyor 310, and provides a space for the wet etching process. In this case, the conveyor 310 is installed to pass through one side wall and other side wall of the bath 320, and horizontally conveys the substrate 110.

The bath 320 is divided into a plurality of spaces for performing the wet etching process for the substrate 110 that is conveyed by the conveyor 310. That is, the bath 320 is divided into a first rinsing zone 322 where the foreign substance removing unit 330 and the first rinsing unit 340 are disposed, an etching zone 324 where the wet etching unit 350 is disposed, a second rinsing zone 326 where the second rinsing unit 360 and the final rinsing unit 370 are disposed, and a drying zone 328 where the drying unit 380 is disposed.

The primary cleaning units 330 and 340 may include the foreign substance removing unit 330 and the first rinsing unit 340.

The foreign substance removing unit 330 is installed at one side of the first rinsing zone 322, and sprays the first de-ionized water having a high pressure on the substrate 110 that is conveyed by the driving of the conveyor 310, thereby removing a foreign substance from the substrate 110. For this end, the foreign substance removing unit 330 includes at least two first spay nozzles 332.

The at least two first spray nozzles 332 are installed at certain intervals on one side of the first rinsing zone 322 to be disposed on the conveyor 310, and sprays the first de-ionized water having a high pressure on the substrate 110, thereby removing a foreign substance from the substrate 110. Herein, the at least two first spray nozzles 332 may be installed at certain intervals on and under one side of the first rinsing zone 322 with the conveyor 310 therebetween, and spray the first de-ionized water on an upper surface and lower surface of the substrate 110.

The first rinsing unit 340 is installed at the other side of the first rinsing zone 322 adjacently to the foreign substance removing unit 330, and sprays the second de-ionized water on the substrate 110 that is conveyed by the driving of the conveyor 310, thereby rinsing (or cleaning) the substrate 110. For this end, the first rinsing unit 340 includes at least two second spay nozzles 342.

The at least two second spray nozzles 342 are installed at certain intervals on the other side of the first rinsing zone 322 to be disposed on the conveyor 310, and sprays the second de-ionized water on the substrate 110 that is conveyed through the foreign substance removing unit 330, thereby rinsing the substrate 110. In this case, the second de-ionized water, which is sprayed by the at least two second spray nozzles 342, may be sprayed to overlap with each other over the substrate 110.

The at least two second spray nozzles 342 may be installed at certain intervals on and under the other side of the first rinsing zone 322 with the conveyor 310 therebetween, and spray the second de-ionized water on an upper surface and lower surface of the substrate 110.

Furthermore, the second de-ionized water, which is used in the first rinsing unit 340 and then recovered, may be used as the first de-ionized water that is used in the foreign substance removing unit 330.

The etching process unit 350 sprays alkaline etching solution on the substrate 110 that is conveyed through the first rinsing unit 340 by the driving of the conveyor 310 to perform the etching process using the second electrode 170 as the mask, and thus, as illustrated in FIG. 2F, the etching process unit 350 simultaneously removes the transparent conductive layer 150 and optoelectric conversion layer 140 in the second separation part 180 to form the cell separation part 180 exposing the first electrode 120. Alternatively, as illustrated in FIG. 3F, the etching process unit 350 simultaneously removes the transparent conductive layer 150 and optoelectric conversion layer 140 in the cell separation pattern 182a and light transmission pattern 184a to form the light transmission part 184 and the cell separation part 182 exposing the first electrode 120.

For this end, the first rinsing unit 350 according to the first embodiment of the present invention includes a plurality of etching solution spay nozzles 352.

The etching solution spray nozzles 352 are installed at certain intervals on the etching zone 324 to be disposed on the conveyor 310, and sprays alkaline etching solution on the substrate 110. In this case, alkaline etching solution sprayed from the etching solution spray nozzles 352 may be sprayed at a pressure of about 0.5 Pa to about 2 Pa, and the spayed alkaline etching solution may be sprayed to overlaps with each other over the substrate 110.

The alkaline etching solution may use at least one solution selected from alkaline-based materials such as NaOH and KOH, or use at least one solution selected from acidic solution such as HCl, $HNO_3$, $H_2SO_4$, $H_3PO_3$, $H_2O_2$, or $C_2H_2O_4$. In this case, using OH-series alkaline-based etching solution is optimal, but H-series acidic-based etching solution may be used.

The alkaline etching solution may be diluted with water and used, in which case the concentration of alkaline solution may be a range of about 5% to about 20%. Furthermore, the temperature of the alkaline etching solution may be maintained at about 60° C. to about 80° C., and an etching time may be a range of about 40 sec to about 80 sec.

In the etching process, since the first electrode 120 formed in the second separation part 180 is formed of a conductive material that which is not easily removed by the alkaline etching solution, the first electrode 120 is not damaged by the etching process.

Figure 8A:
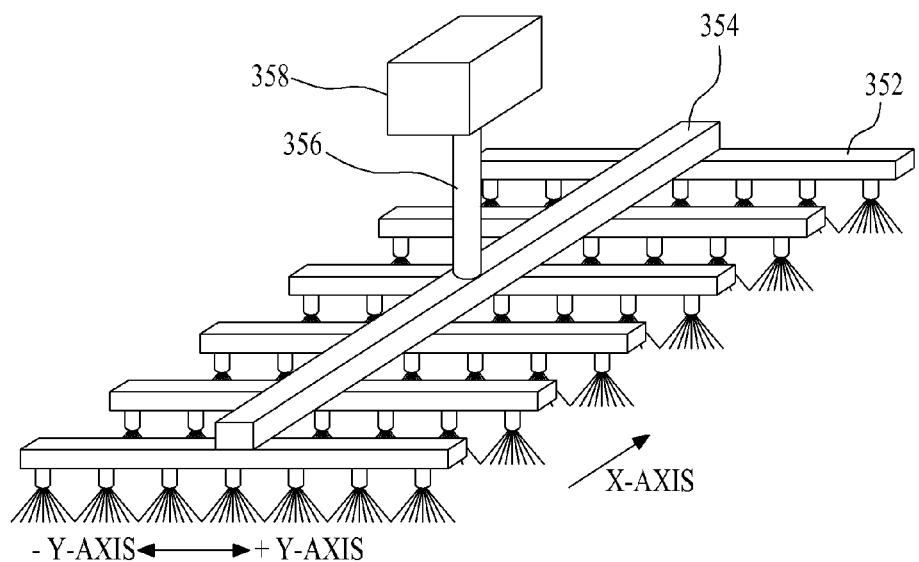
FIGS. 8A to 8C are views for schematically describing embodiments of a wet etching process of FIG. 7.

The wet etching unit 350 according to the second embodiment of the present invention, as illustrated in FIG. 8A, includes a plurality of etching solution spray nozzles 352, a nozzle supporting member 354, a central support member (e.g., a swing axis) 356, and a driving means 358.

The etching solution spray nozzles 352 are installed at certain intervals on the etching zone 324 to be disposed on the conveyor 310, and sprays alkaline etching solution on the substrate 110. For this end, each of the etching solution spray nozzles 352 include a plurality of spray holes that are formed at certain intervals. Herein, a plurality of spray holes formed an adjacent etching solution spray nozzle 352 may be alternately disposed not to overlap with each other.

The nozzle supporting member 354 is installed across the etching solution spray nozzles 352 to support the etching solution spray nozzles 352. The nozzle supporting member 354 is formed in a bar type to support a central portion of each of the etching solution spray nozzles 352, or formed in a trapezoid type to support a central portion and both edges of each of the etching solution spray nozzles 352.

The swing axis 356 is installed at the nozzle supporting member 354 and driven by the driving of a driving means (not shown) to swing the nozzle supporting member 354 by a certain distance in a ±Y-axis direction. Herein, the Y-axis direction is a direction intersecting the conveyed direction of the substrate 110. The swing axis 356 is sealed by bellows (not shown) or a sealing member (not shown), and thus can prevent a solar cell from being damaged by etching steam in etching.

The driving means 358 according to an embodiment of the present invention includes a camshaft (not shown) performing a rotating motion, an eccentric cam (not shown) that is installed to swing in the ±Y-axis direction according to the rotating motion of the camshaft, and a driving motor (not shown) rotating the camshaft.

The driving motor is driven by a driving power having a driving frequency of about 10 Hz to about 50 Hz to rotate the camshaft, and thus moves or swings the central support member or swing axis 356 in correspondence with the driving frequency of about 10 Hz to about 50 Hz.

The driving means 358 according to another embodiment of the present invention includes a pinion that alternately performs a rotating motion counterclockwise and clockwise, a rack that is installed at the swing axis 356 to swing in the ±Y-axis direction according to the rotating motion of the pinion, and a driving motor rotating the pinion.

The wet etching unit 350 according to a second embodiment of the present invention swings the etching solution spray nozzles 352 in the ±Y-axis direction to conformally spray alkaline etching solution on the substrate 110, thereby allowing conformal etching to be performed.

Figure 8B:
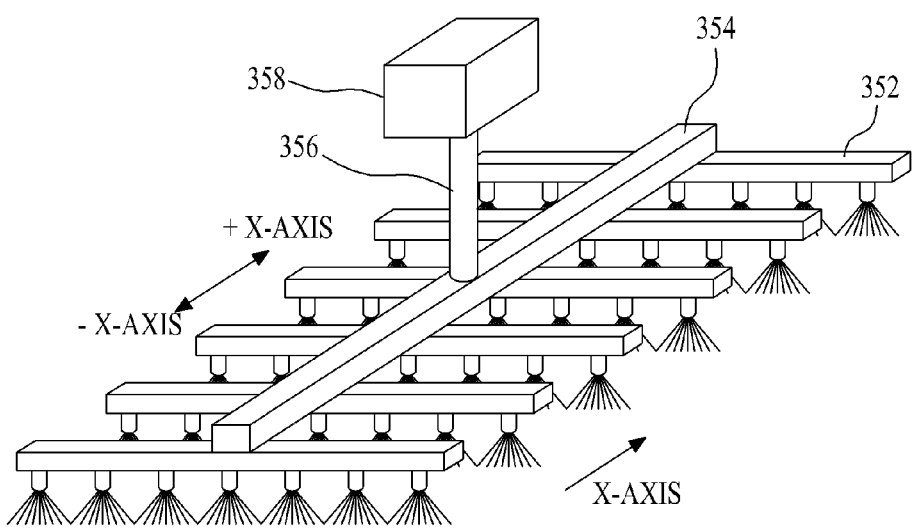

The wet etching unit 350 according to the second embodiment of the present invention swings the etching solution spray nozzles 352 in the ±Y-axis direction, but the embodiment is not limited thereto. The wet etching unit 350, as illustrated in FIG. 8B, may swing the etching solution spray nozzles 352 in a ±X-axis direction equal to a direction where the substrate 110 is conveyed.

Figure 8C:
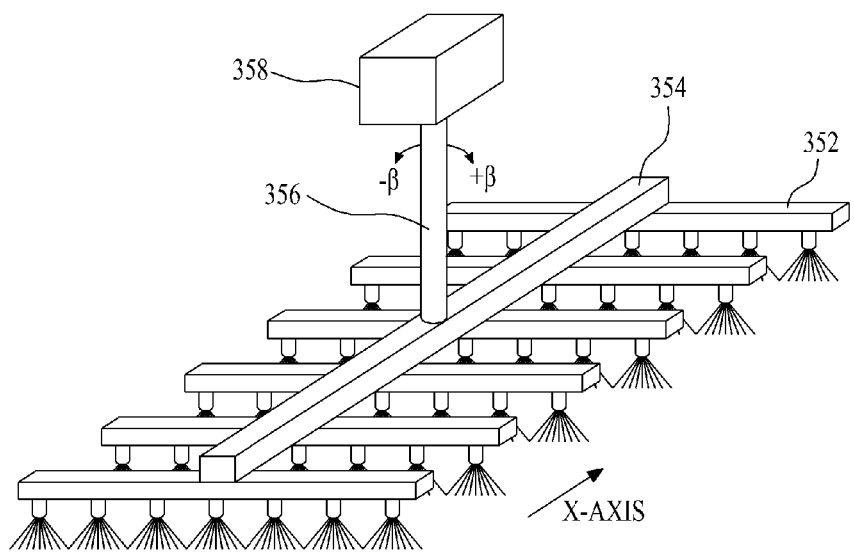

As another example, the wet etching unit 350 according to the second embodiment of the present invention, as illustrated in FIG. 8C, may rotate and reversely rotate the etching solution spray nozzles 352 at a certain ±angle, repeatedly. For this end, the driving means 358 may be configured with a driving motor that is coupled to the swing axis 356 to rotate and reversely rotate the swing axis 356 at a certain ±β angle repeatedly.

Referring again to FIG. 6, the secondary cleaning units 360 and 370 may include the second rinsing unit 360 and the final rinsing unit 370.

The second rinsing unit 360 is installed at one side of the second rinsing zone 326 adjacently to the wet etching unit 350 to spray the third de-ionized water on the substrate 110 that is conveyed by the driving of the conveyor 310, thereby rinsing (or cleaning) the substrate 110. For this end, the second rinsing unit 360 includes at least two third spay nozzles 362.

The at least two third spray nozzles 362 are installed at certain intervals on one side of the second rinsing zone 326 to be disposed on the conveyor 310, and sprays the third de-ionized water on the substrate 110 that is conveyed through the wet etching unit 350, thereby rinsing the substrate 110. In this case, the third de-ionized water, which is sprayed by the at least two third spray nozzles 362, may be sprayed to overlap with each other over the substrate 110.

The at least two third spray nozzles 362 may be installed at certain intervals on and under one side of the second rinsing zone 326 with the conveyor 310 therebetween, and spray the third de-ionized water on an upper surface and lower surface of the substrate 110.

Furthermore, the third de-ionized water, which is used in the second rinsing unit 360 and then recovered, may be used as the second de-ionized water that is used in the first rinsing unit 340.

The final rinsing unit 370 is installed at the other side of the second rinsing zone 326 to spray the fourth de-ionized water on the substrate 110 that is conveyed by the driving of the conveyor 310, thereby rinsing (or cleaning) the substrate 110 finally. For this end, the final rinsing unit 370 includes at least two fourth spay nozzles 372.

The at least two fourth spray nozzles 372 are installed at certain intervals on the other side of the second rinsing zone 326 to be disposed on the conveyor 310, and sprays the fourth de-ionized water on the substrate 110 that is conveyed through the second rinsing unit 360, thereby rinsing the substrate 110 finally. In this case, the fourth de-ionized water, which is sprayed by the at least two fourth spray nozzles 372, may be sprayed to overlap with each other over the substrate 110.

The at least two fourth spray nozzles 372 may be installed at certain intervals on and under the other side of the second rinsing zone 326 with the conveyor 310 therebetween, and spray the fourth de-ionized water on an upper surface and lower surface of the substrate 110.

Furthermore, the fourth de-ionized water, which is used in the final rinsing unit 370 and then recovered, may be used as the third de-ionized water that is used in the second rinsing unit 360.

The drying unit 380 is installed at the drying zone 328 adjacent to the second rinsing zone 326 to dry the substrate 110 that is conveyed by the driving of the conveyor 310. That is, the drying unit 380 removes moisture left on the substrate 110 that is conveyed through the final rinsing unit 370, with an air knife 382 that is disposed on the conveyor 310, thereby performing drying. Herein, the air knife 382 may be disposed to be inclined at a certain angle with respect to a direction in which the substrate 110 is conveyed.

In the etching process unit 270, when the second de-ionized water is left on the substrate 110 that has passed through the first rinsing unit 340, since the alkaline etching solution sprayed by the wet etching unit 350 is mixed with the second de-ionized water, the alkaline etching solution is contaminated, and thus, etching is non-conformally performed. Also, the alkaline etching solution sprayed on the substrate 110 flows into the first rinsing unit 340, is used by the first rinsing unit 340 and then recovered, and thus, the second de-ionized water used as the first de-ionized water is contaminated.

Moreover, in the etching process unit 270, when the alkaline etching solution is left on the substrate 110 that has passed through the wet etching unit 350, the third de-ionized water, which is recovered by the second rinsing unit 360 and reused as the second de-ionized water, is contaminated.

Figure 9:
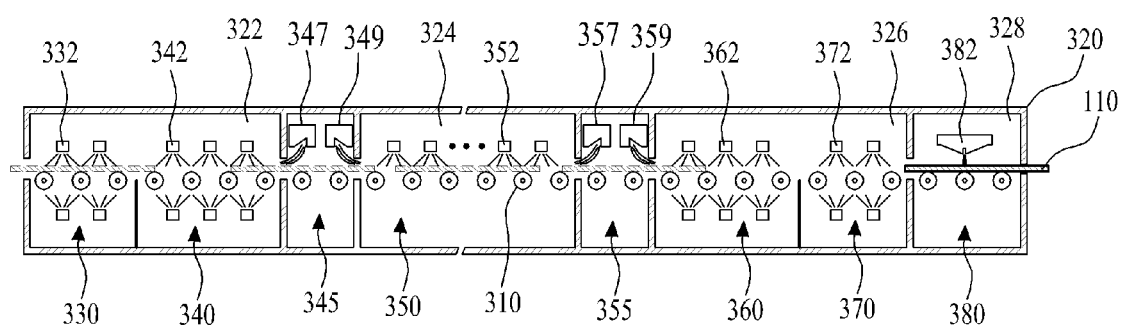
FIG. 9 is a view for schematically describing another embodiment of an etching process of FIG. 5.

To prevent the limitations, as illustrated in FIG. 9, the etching process unit 270 may further include first and second neutral zones 345 and 355.

Figure 10:
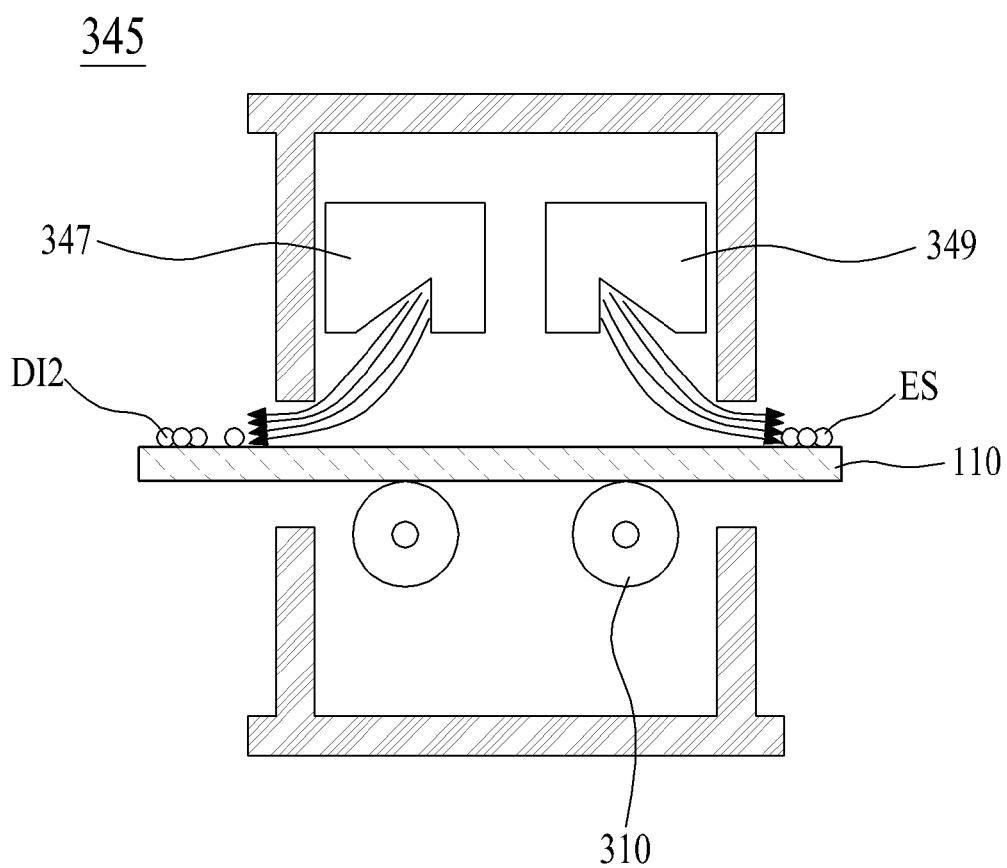
FIG. 10 is a view for schematically describing a first neutral zone of FIG. 9.

The first neutral zone 345 is installed between the first rinsing unit 340 and the wet etching unit 350, and prevents the second de-ionized water used by the first rinsing unit 340 from being mixed with the alkaline etching solution used by the wet etching unit 350. For this end, as illustrated in FIG. 10, the first neutral zone 345 includes first and second air curtains 347 and 349.

The first air curtain 347 is installed on one side of the first neutral zone 345 adjacently to the primarily cleaning unit to spray air or other gas such as nitrogen or argon toward a substrate outlet of the primary cleaning unit. Specifically, the first air curtain 347 is installed on one side of the first neutral zone 345 adjacently to the first rinsing unit 340 to spray a gas (e.g., air) of a certain pressure on the substrate 110 that is conveyed through the first rinsing unit 340 by the driving of the conveyor 310, and thus injects the second de-ionized, which is left on the substrate 110, to inside the first rinsing unit 340.

The second air curtain 349 is installed adjacently to the wet etching unit 350 to spray air or other gas such as nitrogen or argon toward a substrate inlet of the wet etching unit 350 into which a substrate passing through the first air curtain 347 is put. Specifically, the second air curtain 349 is installed on the other side of the first neutral zone 345 adjacently to the wet etching unit 350 to spray a gas (e.g., air) of a certain pressure on the substrate 110 that is conveyed through the first air curtain 347 by the driving of the conveyor 310, and thus injects alkaline etching solution ES, which is sprayed by the wet etching unit 250 and left on the substrate 110, to inside the wet etching unit 350.

Each of the first and second air curtains 347 and 349 may be installed on and under the first neutral zone 345 with the conveyor 310 therebetween, and spray air or other gas on the upper surface and lower surface of the substrate 110.

Referring again to FIG. 9, the second neutral zone 355 is installed between the second rinsing unit 360 and the wet etching unit 350, and prevents the third de-ionized water used by the second rinsing unit 360 from being mixed with the alkaline etching solution used by the wet etching unit 350. For this end, the second neutral zone 355 includes third and fourth air curtains 357 and 359.

The third air curtain 357 is installed adjacently to the wet etching unit 350 to spray air or other gas such as nitrogen or argon toward a substrate outlet of the wet etching unit 350 for discharging a substrate for which the wet etching process has been completed. Specifically, the third air curtain 357 is installed on the other side of the first neutral zone 355 adjacently to the wet etching unit 350 to spray a gas (e.g., air) of a certain pressure on the substrate 110 that is conveyed through the wet etching unit 350 by the driving of the conveyor 310, and thus injects alkaline etching solution, which is left on the substrate 110, to inside the wet etching unit 350.

The fourth air curtain 359 is installed adjacently to the secondary cleaning unit to spray air or other gas such as nitrogen or argon toward a substrate inlet of the secondary cleaning unit into which a substrate passing through the third air curtain 357 is put. Specifically, the fourth air curtain 359 is installed on the other side of the second neutral zone 355 adjacently to the second rinsing unit 360 to spray a gas (e.g., air) of a certain pressure on the substrate 110 that is conveyed through the third air curtain 357 by the driving of the conveyor 310, and thus injects the third de-ionized, which is sprayed by the second rinsing unit 360 and left on the substrate 110, to inside the second rinsing unit 360.

Each of the third and fourth air curtains 357 and 359 may be installed on and under the second neutral zone 355 with the conveyor 310 therebetween, and spray air or other gas on the upper surface and lower surface of the substrate 110.

The above-described method of manufacturing the thin film type solar cell, according to the embodiments of the present invention, forms the second electrode 170 in the printing process, and then forms the cell separation part 182 for separating the optoelectric conversion layer 140 in the wet etching process using the spray process, or forms the light transmission part 184 at the cell separation part 182 and the second electrode 170. Therefore, the method does not use the laser scribing process, and thus can decrease the cost, more shorten time taken in a process than the related art laser scribing process, secure a prospect right sufficient to apply a solar cell in place of a window by using the cell separation part 182 and the light transmission part 184, and facilitate mass production.

As described above, the apparatus and method for manufacturing the thin film type solar cell, according to the embodiments of the present invention, forms the second electrode though the printing process, and thereafter forms the cell separation part that separates the optoelectric conversion layer through the wet etching process using the second electrode as a mask, or forms the light transmission part in the cell separation part and the second electrode.

Accordingly, by forming the second electrode/cell separation part or the second electrode/cell separation part/light transmission part through the printing process and the wet etching process, the apparatus and method according to the embodiments of the present invention can shorten time taken in a process that is performed for the second electrode/cell separation part or the second electrode/cell separation part/light transmission part, thus enhancing productivity.

Moreover, by forming the cell separation part and the light transmission part through the wet etching process instead of the related art laser scribing process, the apparatus and method according to the embodiments of the present invention can secure a prospect right sufficient to apply the solar cell in place of a window, enhance productivity, and reduce the cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a thin film type solar cell, the method comprising:
    a) forming a first electrode over a substrate;
    b) removing a certain region of the first electrode to form a first separation part;
    c) forming an optoelectric conversion layer over the substrate, the substrate further comprising the first electrode and the first separation part;
    d) removing a certain region of the optoelectric conversion layer on the first electrode to form a contact line;
    e) printing a plurality of second electrodes on the optoelectric conversion layer and in the contact line, the second electrodes being connected to the first electrode through the contact line, such that adjacent second electrodes are separated at certain intervals by a second separation part; and
    f) wet etching the optoelectric conversion layer in the second separation part using the plurality of second electrodes as a mask to expose the first electrode in the second separation part wherein wet etching the optoelectric conversion layer comprises:
        primarily cleaning the substrate in a primary cleaning unit;
        spraying a gas toward an outlet of the primary cleaning unit using a first air curtain adjacent to and outside of the primary cleaning unit;
        conveying the primarily cleaned substrate having the second electrodes thereon through a wet etching unit;
        spraying a gas toward an inlet of the wet etching unit using a second air curtain adjacent to and outside of the wet etching unit;
        spraying etching solution on the primarily cleaned substrate in the wet etching unit to wet etch the optoelectric conversion layer;
        secondarily cleaning the substrate on which the etching solution has been sprayed in a secondary cleaning unit; and
        drying the secondarily cleaned substrate.

2. The method according to claim 1, wherein the first electrode comprises a transparent conductive material which is not removed by etching the optoelectric conversion layer.

3. The method according to claim 1, wherein the first electrode comprises a transparent conductive material selected from the group consisting of $SnO_2$, $SnO_2$:F, $SnO_2$:B, $SnO_2$:Al, and indium tin oxide (ITO).

4. The method according to claim 1, wherein the second separation part comprises:
    a) a cell separation pattern separating the second electrode at certain intervals; and
    b) a light transmission pattern formed by removing the second electrode in a certain pattern.

5. The method according to claim 1, further comprising forming a transparent conductive layer on the optoelectric conversion layer, wherein:
    a) a certain region of the transparent conductive layer and a certain region of the optoelectric conversion layer are removed when forming the contact line, and
    b) the transparent conductive layer and the optoelectric conversion layer in the second separation part are removed when etching the optoelectric conversion layer.

6. The method according to claim 1, wherein the etching solution comprises at least one member selected from the group consisting of NaOH, KOH, $NH_4OH$, HCl, $HNO_3$, $H_2SO_4$, $H_3PO_3$, $H_3PO_4$, $H_2O_2$, HCOOH and $C_2H_2O_4$.

7. The method according to claim 1, wherein the etching solution is sprayed using spray nozzles, and the method further comprises moving or swinging the spray nozzles a certain distance or a certain angle as the etching solution is sprayed.

8. The method according to claim 1, further comprising:
    a) spraying a gas toward an outlet of the wet etching unit using a third air curtain adjacent to the wet etching unit; and
    b) spraying a gas toward an inlet of the secondary cleaning unit using a fourth air curtain adjacent to the secondary cleaning unit.

9. The method according to claim 1, wherein printing the second electrode comprises printing a paste comprising at least one of Ag, Al, and Cu on the optoelectric conversion layer.

10. The method of claim 1, wherein the optoelectric conversion layer comprises a silicon-based semiconductor material.

11. The method of claim 10, wherein the optoelectric conversion layer includes a P type semiconductor layer, an I type semiconductor layer, and an N type semiconductor layer in sequence.

12. The method of claim 1, wherein the optoelectric conversion layer comprises a first optoelectric conversion layer, a buffer layer, and a second optoelectric conversion layer in sequence.

13. The method of claim 1, wherein the buffer layer comprises a transparent conductive material that is removed when wet etching the optoelectric conversion layer.

14. The method of claim 1, wherein the optoelectric conversion layer further comprises a second buffer layer and a third optoelectric conversion layer in sequence on the second optoelectric conversion layer.

15. The method of claim 1, wherein the contact line is formed in parallel to the first separation part and exposes a region of the first electrode adjacent to the first separation part.

16. The method of claim 1, wherein printing the second electrode comprises a screen printing process, an inkjet printing process, a gravure printing process, a gravure offset printing process, a reverse printing process, a flexo printing process, or a micro contact printing process.

17. The method of claim 1, further comprising, after printing the second electrode, sintering the printed second electrode.

18. The method of claim 4, wherein the light transmission pattern has a stripe form intersecting the cell separation pattern, a curved shape, a figure shape, a sign shape, or a character shape.

* * * * *